United States Patent
Reeder et al.

(10) Patent No.: US 10,261,152 B2
(45) Date of Patent: Apr. 16, 2019

(54) SYSTEM AND METHOD FOR CONFOUNDER-CORRECTED T1 MEASURES USING MRI

(71) Applicant: Wisconsin Alumni Research Foundation, Madison, WI (US)

(72) Inventors: Scott B. Reeder, Middleton, WI (US); Xiaoke Wang, Madison, WI (US); Diego Hernando, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 58 days.

(21) Appl. No.: 15/466,646

(22) Filed: Mar. 22, 2017

(65) Prior Publication Data

US 2018/0275235 A1    Sep. 27, 2018

(51) Int. Cl.
| | |
|---|---|
| *G01R 33/50* | (2006.01) |
| *G01R 33/54* | (2006.01) |
| *G01R 33/56* | (2006.01) |

(52) U.S. Cl.
CPC ........ *G01R 33/543* (2013.01); *G01R 33/50* (2013.01); *G01R 33/5608* (2013.01)

(58) Field of Classification Search
CPC ... G01R 33/543; G01R 33/50; G01R 33/5608
See application file for complete search history.

(56) References Cited

U.S. PATENT DOCUMENTS

| | | | |
|---|---|---|---|
| 6,064,203 A | 5/2000 | Bottomley | |
| 2014/0330106 A1 | 11/2014 | Banerjee et al. | |
| 2016/0278661 A1* | 9/2016 | Griswold | ............... A61B 5/055 |
| 2016/0282430 A1* | 9/2016 | Gulani | ............... G01R 33/4828 |

OTHER PUBLICATIONS

Banerjee, et al., Multiparametric magnetic resonance for the non-invasive diagnosis of liver disease. J Hepatol 2014;60(1):69-77.
Blum, et al., Spin-lattice relaxation time measurement by means of a TurboFLASH technique. Magn Reson Med 1993;30(3):289-295.
Bydder, et al., Relaxation effects in the quantification of fat using gradient echo imaging. Magn Reson Imaging. 2008;6(3):347-59.

(Continued)

*Primary Examiner* — Rodney A Bonnette
(74) *Attorney, Agent, or Firm* — Quarles & Brady LLP

(57) ABSTRACT

A system and method are provided for determining B1 inhomogeneities or creating a T1 map of a subject using a magnetic resonance imaging (MRI) system that is corrected for an influence of a presence of fat and a presence of iron in the subject on T1 weighting. The method includes controlling the MRI system using a single pulse sequence to acquire, from the subject, a plurality of datasets with varied T1 weighting created by varying at least one of a repetition time (TR) and a flip angle (FA) for repetitions of the single pulse sequence. The method also includes using an MR signal model and the plurality of datasets, estimating B1 inhomogeneities or generating a T1 map of the subject that is corrected for an influence of a presence of fat and a presence of iron in the subject on T1 weighting in the plurality of datasets.

39 Claims, 9 Drawing Sheets

(56) References Cited

OTHER PUBLICATIONS

Deoni, et al., Rapid combined T1 and T2 mapping using gradient recalled acquisition in the steady state. Magn Reson Med 2003;49(3):515-526.

Haaf, et al., Cardiac T1 Mapping and Extracellular Volume (ECV) in clinical practice: a comprehensive review. J Cardiovasc Magn Reson 2016;18(1):89.

Hamilton, et al., In vivo breath-hold (1) H MRS simultaneous estimation of liver proton density fat fraction, and T1 and T2 of water and fat, with a multi-TR, multi-TE sequence. J Magn Reson Imaging 2015;42(6):1538-43.

Hurley, et al., Simultaneous variable flip angle-actual flip angle imaging method for improved accuracy and precision of three-dimensional T1 and B1 measurements, Magn Reson Med. Jul. 2012;68(1):54-64.

Johnson, et al., Effect of flip angle on the accuracy and repeatability of hepatic proton density fat fraction estimation by complex data-based, T1-independent, T2*-corrected, spectrum-modeled MRI. J Magn Reson Imaging. 2014;39(2):440-7.

Liu, et al., Fat quantification with IDEAL gradient echo imaging: correction of bias from T(1) and noise. Magn Reson Med 2007;58(2):354-364.

Manuel, et al., Variable flip angle-based fast three-dimensional T1 mapping for delayed gadolinium-enhanced MRI of cartilage of the knee: need for B1 correction. Magn Reson Med. 2011;65(5):1377-83.

Mozes, et al., Influence of fat on liver T1 masurements using modified Look-Locker inversion recovery (MOLLI) methods at 3T. J Magn Reson Imagin 2016;44(1):105-11.

Sado, et al., Noncontrast myocardial T1 mapping using cardiovascular magnetic resonance for iron overload. J Magn Reson Imaging. 2015;41(6):1505-11.

Wang, et al., T1 corrected fat quantification using a dual flip angle acquisition and joint fit reconstruction. E-poster. International Society for Magnetic Resonance in Medicine 23rd Annual Meeting, Jun. 2, 2015 Toronto, Canada. Book of Abstracts, Program No. 3661.

Yarnykh, Actual Flip-Angle Imaging in the Pulsed Steady State: A Method for Rapid Three-Dimensional Mapping of the Transmitted Radiofrequency Field, Magnetic Resonance in Medicine 57:192-200 (2007).

* cited by examiner

SYSTEM AND METHOD FOR CONFOUNDER-CORRECTED T1 MEASURES USING MRI

STATEMENT REGARDING FEDERALLY SPONSORED RESEARCH

This invention was made with government support under DK083380, DK088925, DK100651, and DK102595 awarded by the National Institutes of Health. The government has certain rights in the invention.

BACKGROUND

The field of the invention is systems and methods for magnetic resonance imaging ("MRI"). More particularly, the invention relates to systems and methods for separating signal contributions from two or more chemical species using MRI.

Nonalcoholic fatty liver disease (NAFLD) is the most common cause of liver disease in the western world, affecting an estimated 100 million Americans. NAFLD is associated with obesity, diabetes, and the metabolic syndrome, and is rapidly becoming a leading cause of liver failure and hepatocellular carcinoma. It is currently the second leading indication for liver transplantation at University of Wisconsin-Madison, and is expected to overtake viral hepatitis as the leading cause, within the next decade. Given the increasing worldwide epidemic of obesity and diabetes, it is expected that this disorder will grow in prevalence.

The earliest and hallmark feature of NAFLD is the abnormal accumulation of intracellular triglycerides within hepatocytes. Accumulation of fat within hepatocytes can lead to hepatocyte injury and inflammation, and subsequent development of fibrosis and cirrhosis, and eventually carcinoma and/or liver failure. The presence of inflammation and liver fibrosis, known as nonalcoholic steatohepatitis (NASH) is a more aggressive subset of NAFLD. Identification of those patients with NASH is a key diagnostic consideration. Biopsy is the currently accepted reference standard for the diagnosis, grading, and staging of NAFLD/NASH. However, biopsy is expensive, invasive, and is limited for quantitative grading and staging due to the inherent sampling variability from sampling a small amount of tissue within the liver.

Some have tried to develop non-invasive techniques for even just diagnosis of NAFLD/NASH. Such techniques would reduce the need for invasive biopsy until a diagnosis for NAFLD/NASH, whereby the biopsy is performed for grading and staging. Of course, it would be preferred to have a non-invasive technique that enables diagnosis, grading, and staging of NAFLD/NASH.

Emerging, quantitative magnetic resonance imaging-based biomarkers have shown promise in recent years for quantifying features of diffuse liver disease, including fat content, $R2^*(=1/T2^*)$ as a biomarker of iron concentration. Also, other biomarkers, such as provided by techniques like MR elastography, can provide measures of tissue stiffness as a biomarker of liver fibrosis.

More recently, some have proposed a T1 mapping technique to serve as a biomarker of extracellular fluid (ECF) content and fibrosis. For example, this technique is described in US Patent Publication No. 2014/0330106. In particular, in the presence of fibrosis, the water content of tissue will increase, which lengthens tissue T1. However, in the presence of diffuse liver disease, iron often accumulates. Iron, in addition to shortening $T2^*$ (increasing $R2^*$), shortens T1. Thus, such methods relying on T1 mapping can be confounded by the shortened T1 caused by the presence of iron.

Some have sought to address this challenge, in part, by acquiring a second dataset that is used to correct the first dataset that is acquired to create the T1 map. In this way, two data sets are acquired to create a "corrected" T1 map. Specifically, a first MRI data acquisition is performed to acquire a T1 map using a "modified Look-Locker" or MOLLI approach. Then, a second MRI acquisition is performed to acquire a $T2^*$ map. For a given pixel in the T1 map, the corresponding $T2^*$ value is used to make an empirical correction for T1. In this way, an iron-corrected estimate of T1 is provided.

This approach has the undesired requirement that two separate datasets must be acquired. First, the need to acquire two datasets increases scan time. Second, the use of two separately-acquired datasets creates the prospect of misregistration between the T1 and $T2^*$ maps.

Thus, it would be desirable to have non-invasive tools for evaluating, including diagnosis, grading, and staging, organs, including the liver.

SUMMARY

The present invention overcomes the aforementioned drawbacks by providing systems and methods for estimating B1 inhomogeneities and/or performing simultaneous estimates of water and fat signals, as well as T1 and $T2^*$. Advantageously, these the data acquisition for these simultaneous estimates can be performed in a single acquisition that is of a duration that can be performed within a single breath hold. More particularly, the present disclosure recognizes that both T1 and $T2^*$ maps will be confounded by the presence of fat, if fat is not accounted for in the estimation process. Fat, if present, will also confound the estimation of tissue T1 because the T1 of fat is typically shorter than other tissue, such as that of liver parenchyma as one non-limiting example. Further, the proposed method can also estimate, and therefore be used to correct for the presence of inhomogeneity of the radiofrequency (RF) field used to excite the MR signal (i.e., B1 inhomogeneity). Thus, as described herein, the present disclosure provides systems and methods to acquire simultaneous T1, $T2^*$, and water and fat signals that can be used to provide fat-corrected and iron-corrected estimates of T1, fat-corrected estimates of $T2^*$, and both T1- and $T2^*$-corrected estimates of, as non-limiting example, liver fat content, from a single MR data acquisition. In addition, the systems and methods can provide additional information that is of substantial clinical value, such as estimating tissue fat or tissue water concentration in the form of the proton density fat fraction (PDFF) or proton density water fraction (PDWF). PDFF is a well-validated biomarker of liver fat content and PDWF is a biomarker of breast fibroglandular tissue volume and density. Thus, the techniques described herein provide substantial tools that are useful across an array of clinical setting and for evaluating diverse clinical indications.

In accordance with one aspect of the disclosure, a method is provided for creating a T1 map of a subject using a magnetic resonance imaging (MRI) system. The method includes controlling the MRI system using a single pulse sequence to acquire, from the subject, a plurality of datasets with varied T1 weighting created by varying at least one of a repetition time (TR) and a flip angle (FA) for repetitions of the single pulse sequence. The method also includes using an MR signal model and the plurality of datasets, generating a T1 map of the subject that is corrected for an influence of a presence of fat and a presence of iron in the subject on T1 weighting in the plurality of datasets.

In accordance with another aspect of the disclosure, a magnetic resonance imaging (MRI) system is provided that includes a magnet system configured to generate a polarizing magnetic field about at least a portion of a subject arranged in the MRI system, a plurality of gradient coils configured to apply a gradient field to the polarizing magnetic field and a radio frequency (RF) system configured to apply an excitation field to the subject and acquire MR image data from a ROI. The MRI system also includes a computer system programmed to control the plurality of gradient coils and the RF system to perform a single pulse sequence to acquire, from the subject, a plurality of datasets with varied T1 weighting created by varying a repetition time (TR) between repetitions of the single pulse sequence. The computer is also programmed to use an MR signal model and the plurality of datasets, generate a T1 map of the subject that is corrected for an influence of a presence of fat and a presence of iron in the subject on T1 weighting in the plurality of datasets.

In accordance with yet another aspect of the disclosure, a method is provided for creating a T1 map of a subject using a magnetic resonance imaging (MRI) system. The method includes controlling the MRI system using a single pulse sequence to acquire, from the subject, a plurality of datasets with varied T1 weighting created by varying a repetition time (TR) between repetitions of the single pulse sequence. The method also includes using an MR signal model and the plurality of datasets, generating a T1 map of the subject that is corrected for an influence of a presence of fat and a presence of iron in the subject on T1 weighting in the plurality of datasets.

In accordance with still another aspect of the disclosure, a method is provided for creating estimating B1 field inhomogeneity of a magnetic resonance imaging (MRI) system. The method includes controlling the MRI system using a single pulse sequence to acquire a plurality of datasets with varied T1 weighting created by varying a repetition time (TR) between repetitions of the single pulse sequence. The method also includes using an MR signal model and the plurality of datasets, estimating B1 inhomogeneities present when acquiring the plurality of datasets.

The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION

Figure 1:
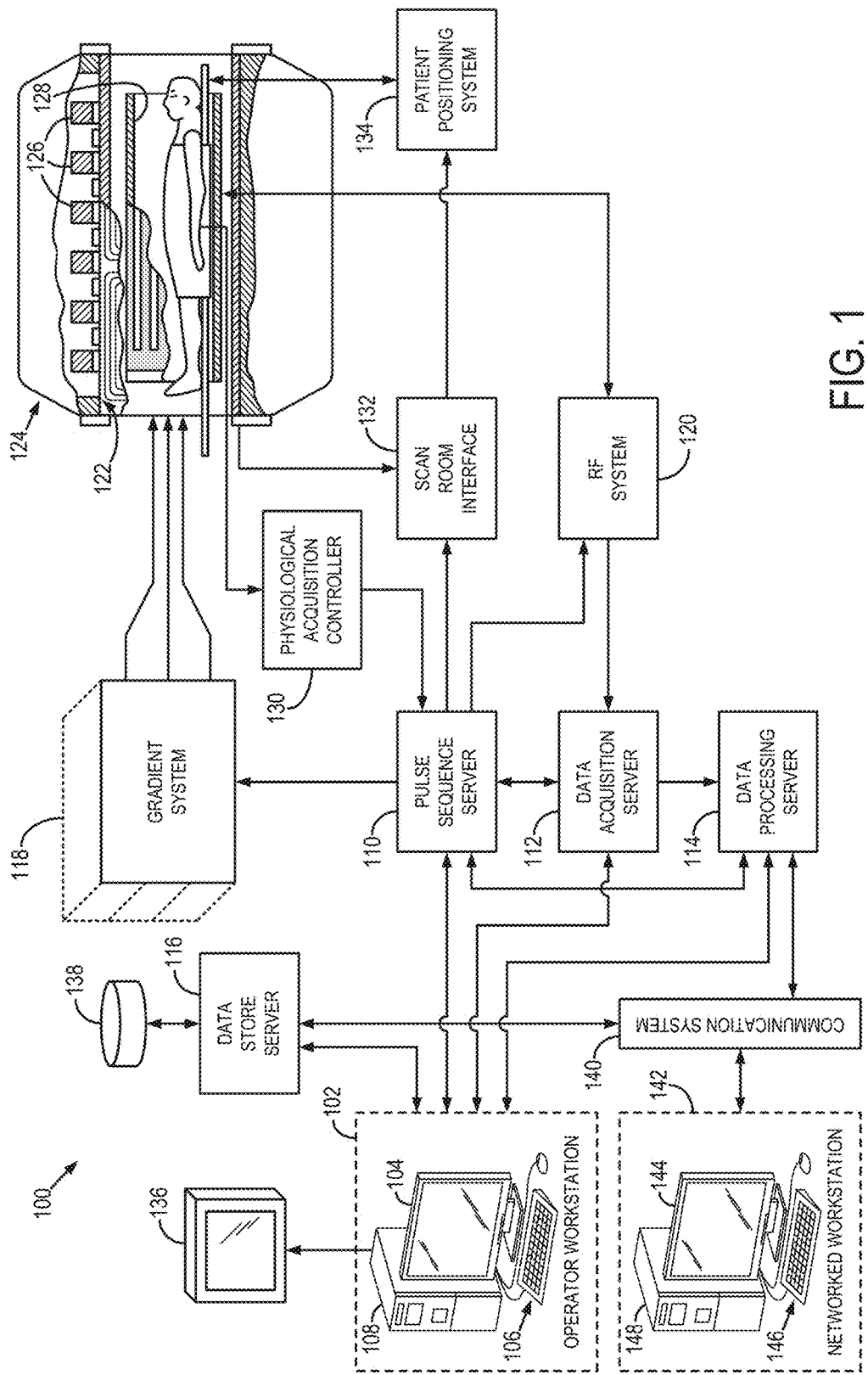
FIG. 1 is a block diagram of an exemplary magnetic resonance imaging ("MRI") system configured in accordance with the present disclosure.

As described above, recent studies have demonstrated the utility of T1 mapping as a biomarker of liver inflammation. The presumed mechanism for T1 mapping in the presence of inflammation is increased water content of the tissue, which prolongs T1. However, there are several confounders of T1 estimation, including the presence of iron. Iron overload is known to occur in diffuse liver disease, and the presence of iron will shorten the T1, confounding the ability to quantify the effects of inflammation on T1. Some have demonstrated the use of iron-sensitive MRI methods, such as T2*mapping methods (note that T2*=1/R2*) to correct for the effects if iron in the liver, in order to create an iron-corrected T1 map. However, this requires the clinician to acquire the T1 data for the T1 map and the T2*data for the T2*map, meaning that the patient must endure the acquisition of separate iron sensitive maps such as R2*(or T2*) maps in order to make this correction to the T1 map. Also, the separate acquisition creates the potential for spatial mis-registration. Further, the presence of fat, which is present in many patients particularly those with NAFLD and other forms of chronic liver disease, will also confound T1 measurements, because the T1 of fat is shorter than the T1 of free water within tissue. Therefore, even beyond the need to correct for iron, there is an unmet need to correct T1 estimates for the presence of fat.

As will be described, the present disclosure provides a confounder-corrected approach for simultaneous estimation of R2*, fat content (in the form of PDFF), and the T1 of water and fat signals. Through simultaneous estimation of these parameters, fat- and iron-corrected T1 mapping is possible. The present disclosure also provides fat-corrected estimates of R2*as a biomarker of tissue iron concentration, and also fat- and T1-corrected estimates of PDFF.

As will be described in detail, the present disclosure provides multiple approaches, with variants of each, to perform simultaneous T1 mapping, R2*mapping, and PDFF mapping. Each approach acquires multiple (2 or more) multi-echo, chemical-shift-encoded acquisitions with different T1 weighting. As one example spoiled gradient echo (SGRE) signal is acquired. As will be described, SGRE pulse sequences can be manipulated by altering one (or both) of two imaging parameters: the flip angle and/or the repetition time (TR). Therefore, altering the flip angle and/or TR, either sequentially or in an interleaved fashion, or combined sequential and interleaved, provides the desired datasets, including varied T1 weighting. The SGRE signal has a signal model that is well understood, such that simultaneous fitting of PDFF, R2*, and T1 (water and fat) can be performed using the datasets with different T1-weighting. One of the SGRE acquisitions may be performed with reduced number of echoes and alternating TR to provide the ability to correct B1-inhomogeneity-induced bias in T1 estimates without lengthening the scan time.

Referring now to FIG. 1, these confounder-corrected approaches may be implemented using or designed to accompany a magnetic resonance imaging ("MRI") system 100, such as is illustrated in FIG. 1. The MRI system 100 includes an operator workstation 102, which will typically include a display 104, one or more input devices 106 (such as a keyboard and mouse or the like), and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to multiple servers, including a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a gradient system 118 and a radiofrequency ("RF") system 120. Gradient waveforms to perform the prescribed scan are produced and applied to the gradient system 118, which excites gradient coils in an assembly 122 to produce the magnetic field gradients $G_x$, $G_y$, $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil, are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M = \sqrt{I^2 + Q^2} \qquad \text{Eqn. 1;}$$

and the phase of the received magnetic resonance signal may also be determined according to the following relationship:

$$\varphi = \tan^{-1}\left(\frac{Q}{I}\right). \qquad \text{Eqn. 2}$$

The pulse sequence server 110 also optionally receives patient data from a physiological acquisition controller 130. By way of example, the physiological acquisition controller 130 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled. In still another example, the data acquisition server 112 may also be employed to process magnetic resonance signals used to detect the arrival of a contrast agent in a magnetic resonance angiography ("MRA") scan. By way of example, the data acquisition server 112 acquires magnetic resonance data and processes it in real-time to produce information that is used to control the scan.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction techniques, such as iterative or backprojection reconstruction techniques; applying filters to raw k-space data or to reconstructed images; generating functional magnetic resonance images; calculating motion or flow images; and so on.

Images reconstructed by the data processing server 114 are conveyed back to the operator workstation 102. Images may be output to operator display 112 or a display 136 that is located near the magnet assembly 124 for use by attending clinician. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144, one or more input devices 146 (such as a keyboard and mouse or the like), and a processor 148. The networked workstation 142 may be located within the same facility as the operator workstation 102, or in a different facility, such as a different healthcare institution or clinic. The networked workstation 142 may include a mobile device, including phones or tablets.

The networked workstation 142, whether within the same facility or in a different facility as the operator workstation 102, may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may exchanged between the data processing server 114 or the data store server 116 and the networked workstations 142, such that the data or images may be remotely processed by a networked workstation 142. This data may be exchanged in any suitable format, such as in accordance with the transmission control protocol ("TCP"), the internet protocol ("IP"), or other known or suitable protocols.

The above-described system may be configured or otherwise used to carry out processes in accordance with the present disclosure. In particular, as will be described in further detail, one aspect for using the above-described or similar systems for carrying out processes in accordance with the present disclosure includes performing a pulse sequence to acquire data for T1 mapping in accordance with the present disclosure. There are multiple ways in which T1 mapping can be performed. One non-limiting example of a pulse sequence includes the so-called "look-locker" (LL) or modified look-locker (MOLLI) pulse sequences.

Figure 2:
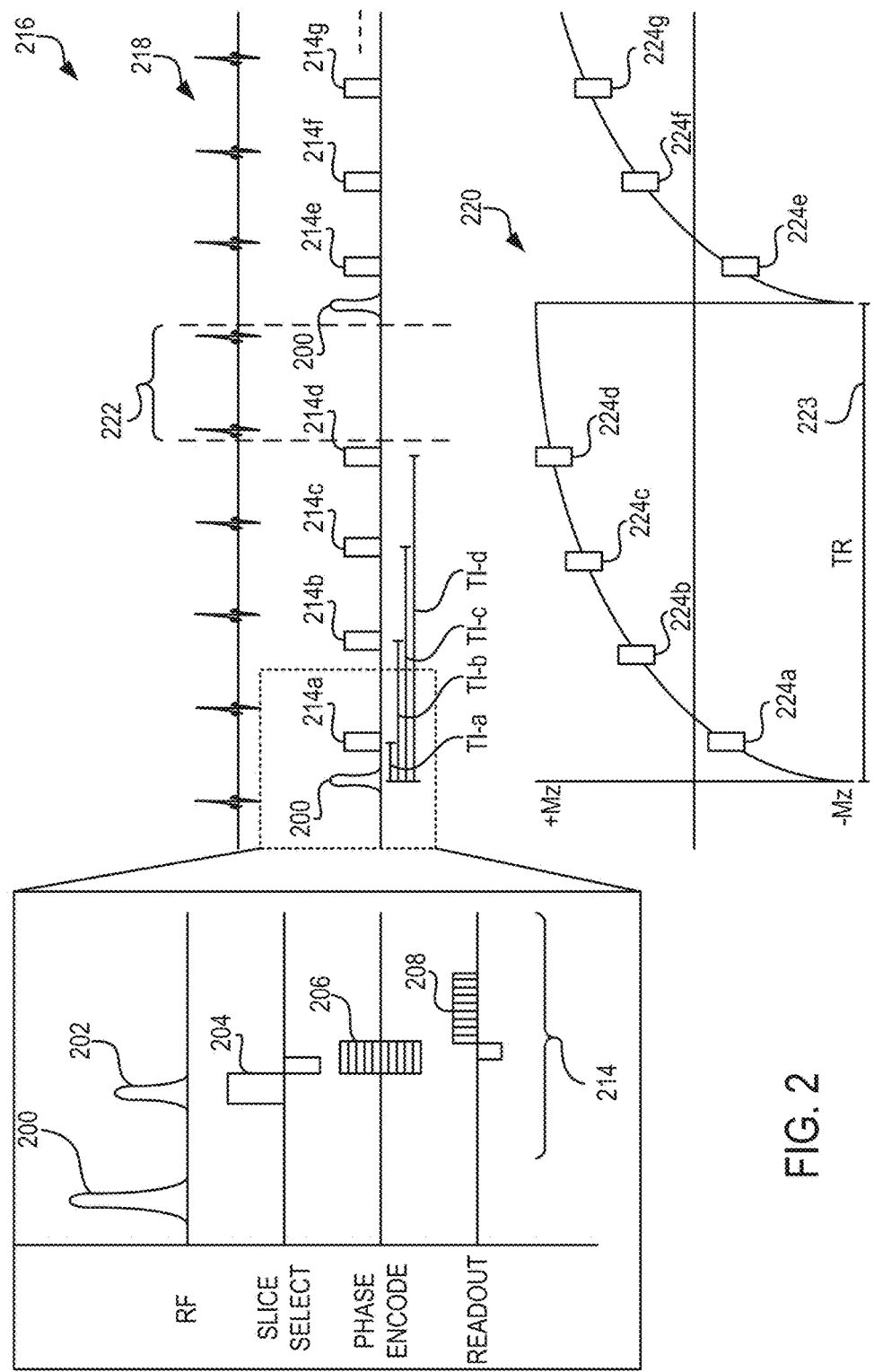
FIG. 2 is a graphic representation of an exemplary pulse sequence for directing the MRI system of FIG. 1 to acquire image data in accordance with the present disclosure.
Figure 3:
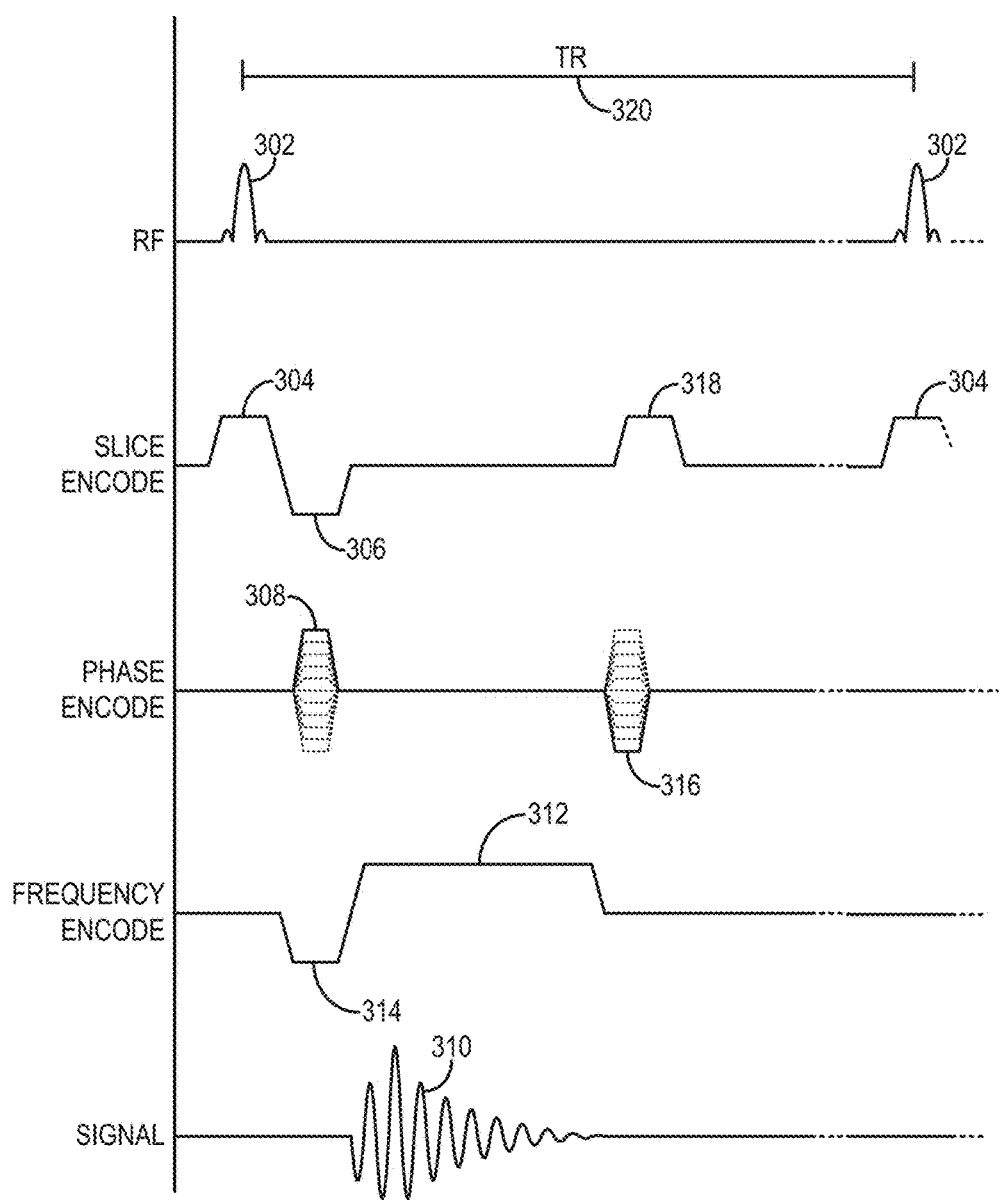
FIG. 3 is a graphic representation of an exemplary pulse sequence for directing the MRI system of FIG. 1 to acquire image data in accordance with the present disclosure.

In one non-limiting example, as shown in FIG. 2, a non-slice-selective inversion recovery (IR) pulse 200 precedes a look-locker echo-planar image (LL-EPI) acquisition 214. The LL-EPI sequence includes an RF excitation pulse 202, a slice select gradient lobe 204 that excites at least one slice from which NMR signals are acquired, a phase encoding gradient lobe 206, and a rapid readout gradient 208. As will be described, the combination of the IR pulse with the LL-EPI sequence allows for the rapid measurement of the T1 relaxation curve.

The MOLLI pulse sequence 216 is based on the LL pulse sequence and, in the case of a cardiac application, may be timed or gated with respect the cardiac cycle 218 to sample different portions of a T1 recovery or relaxation curve 220 during different heart beats in the cardiac cycle 218. In non-cardiac applications, such as liver imaging, cardiac gating can be foregone. In particular, the MOLLI pulse sequence 216 uses the IR pulse followed by a series of subsequent acquisitions 214a, 215b, 214c, 214d. Thus, acquisitions are performed at varying interval times (TI), as will be described. A period 222 may be observed to finish a given repetition time (TR) 223 before a subsequent IR pulse 200 and associated acquisitions 214e, 214f, 214g, etc. are performed. When performing a full study, 2-3 IR pulses 200 followed by several acquisitions, which may be of various forms, including a balanced steady state free precession (b-SSFP) acquisition, may be performed to acquire all desired data.

By acquiring the multiple datasets 224a, 224b, 224c, 224d, 224e, 224f, 224g, at different interval times, the multiple datasets 224a, 224b, 224c, 224d, 224e, 224f, and 224g can be correlated with the T1 relaxation curve 220. With the multiple datasets 224a, 224b, 224c, 224d, 224e, 224f, 224g correlated along the T1 relaxation curve 220, a regression, such as a least squares regression, can be performed to estimate T1 across the subject and create a T1 map.

There are multiple variants of the above-described acquisitions, including saturation recovery techniques, whereby a saturation pulse or pulses (90° or 180°) are used to prepare the magnetization and provide T1 weighting, while rapid imaging samples the magnetization at different inversion times. Each acquisition strategy has strengths and weaknesses and the particular acquisition strategy can be selected based on maximizing the strengths and controlling weaknesses. For example, one disadvantages of LL-based techniques includes relatively long scan times and the perturbation of the magnetization due to imaging RF pulses during the magnetization recovery.

An alternative approach for T1 mapping may be achieved using a multiple flip angle (MFA) technique. A MFA pulse sequence may be created using, for example, two or more three-dimensional (3D) spoiled gradient echo (SGRE) or spoiled gradient recalled echo (SPGR) performed using multiple different flip angles, while maintaining all other imaging parameters constant.

The exemplary SGRE pulse sequence includes a spatially selective excitation pulse 302 that is repeated at the start of each TR. The flip angle for this excitation pulse 302 may be varied with each TR to, thereby, varying the amount of T1 weighting. That is, the varied flip angle causes variation in the amount of T1 weighting reflected in the given dataset and, by acquiring two or more full datasets at different T1 weightings, it is possible to estimate the T1 of the local tissue.

The excitation pulse 302 is played out in the presence of a slice-selective gradient 304 in order to produce transverse magnetization in a prescribed imaging slice. The slice-selective gradient 304 includes a rephasing lobe 306 that acts to rephase unwanted phase accruals caused by the RF excitation pulse 302. Following excitation of the nuclear spins in the prescribed imaging slice, a phase encoding gradient 308 is applied to spatially encode a nuclear magnetic resonance signal, representative of a gradient-recalled echo 310, along one direction in the prescribed imaging slice. A readout gradient 312 is also applied after a dephasing gradient lobe 314 to spatially encode the signal representative of echo 310 along a second, orthogonal direction in the prescribed imaging slice. The signal representative of echo 310 is sampled during a data acquisition window.

A rewinder gradient 316 is played out along the phase-select gradient axis in order to rephase remaining transverse magnetization in preparation for subsequent repetitions of the pulse sequence. As is well known in the art, the pulse sequence is repeated and the amplitude of the phase-encoding gradient 306 and the rewinder gradient 316, which is equal in amplitude and area, but opposite in polarity with respect to the phase-encoding gradient 306, are stepped through a set of values such that k-space is sampled in a prescribed manner. The pulse sequence may conclude with the application of a spoiler gradient 318 that spoils the remaining transverse magnetization.

With this background in place for acquiring T1 maps, the present disclosure recognizes that MFA imaging, for example, dual flip angle (DFA) imaging, can be implemented with chemical shift encoded MRI (CSE-MRI) to provide T1-corrected estimates liver fat content. More particularly, such a DFA imaging strategy can be further augmented. Namely, a DFA/CSE-MRI acquisition may be performed, where the T2* of both acquisitions are constrained to be equal, as part of a joint estimation that improves SNR performance of T1-corrected fat estimation. As will be described herein, such an MFA approach combined with CSE-MRI methods may be further extended to achieve fat-corrected T1 mapping.

Advantageously, the MFA technique is relatively rapid and the signal characteristics of the SGRE signal are well understood. Unfortunately, B1 inhomogeneities can substantially impact the accuracy of using MFA for T1 mapping. This is because B1 inhomogeneities induce variations in the flip angle across the image, and, thus, the actual flip angle that is utilized may be different from that selected because the B1 inhomogeneities caused the effective flip angle to vary. Without an accurate understanding of the actual or effective flip angle that was used, it is difficult to provide accurate T1 weighting for a given acquisition.

Also, B1 inhomogeneities typically occur at higher field strengths such as 3T but can occur at 1.5T, particularly in the presence of abdominal fluid (ascites). Fortunately, rapid B1 mapping methods are now commercially available and can be used to determine the local flip angles, mitigating the effects of B1 inhomogeneities.

Additionally or alternatively, as will be addressed, an "actual flip angle" method may be utilized to address B1 inhomogeneities, That is, an actual flip angle method may be used to acquire SGRE data with the same flip angle, but different TRs. In most circumstances, this is viewed as being inefficient because the use of different TR's often dictates inserting dead time into the acquisition. However, in the case at hand, different echo train lengths can be utilized and the transverse magnetization can be sampled very efficiently. Using an actual flip angle method, the actual flip angle can be measured and the B1 inhomogeneities accounted for because any differential T1 weighting comes from changes in TR. Furthermore, a map T1 can be created using this data, corrected for B1 inhomogeneities.

For example, two acquisitions may be performed with different TRs and different flip angles. However, any error in B1 may be assumed to affect each flip angle proportionately. For example, if a 20% error in B1 is observed, and a 10 degree and a 20 degree flip angle was desired, it can be assumed that the actual flip angle may be 8 degree and 16 degrees. Thus, a generalized version of the actual flip angle imaging is achieved with different flip angles, which thereby permits for measurement of and, therefore, full compensation of B1 inhomogeneities.

An alternative approach to MFA-based techniques is to use a single flip angle with each excitation pulse 302 and to adjust the TR 320 and acquire multiple SGRE data sets with varying TR 320 to create differential T1 weighting between data sets. This technique can be referred to as a multiple TR (MTR) technique. While precise adjustment of the flip angle can be difficult due to hardware constraints as well as B1 inhomogeneities, as described above, TR can be adjusted very precisely to generate differential T1 weighting between two or more SGRE acquisitions. As an even further option, it is possible to vary both the flip angle of the excitation pulse 302 and the TR 302 between multiple SGRE acquisitions to create differential T1 weighting between the acquisition of two or more 3D data sets.

Figure 4:
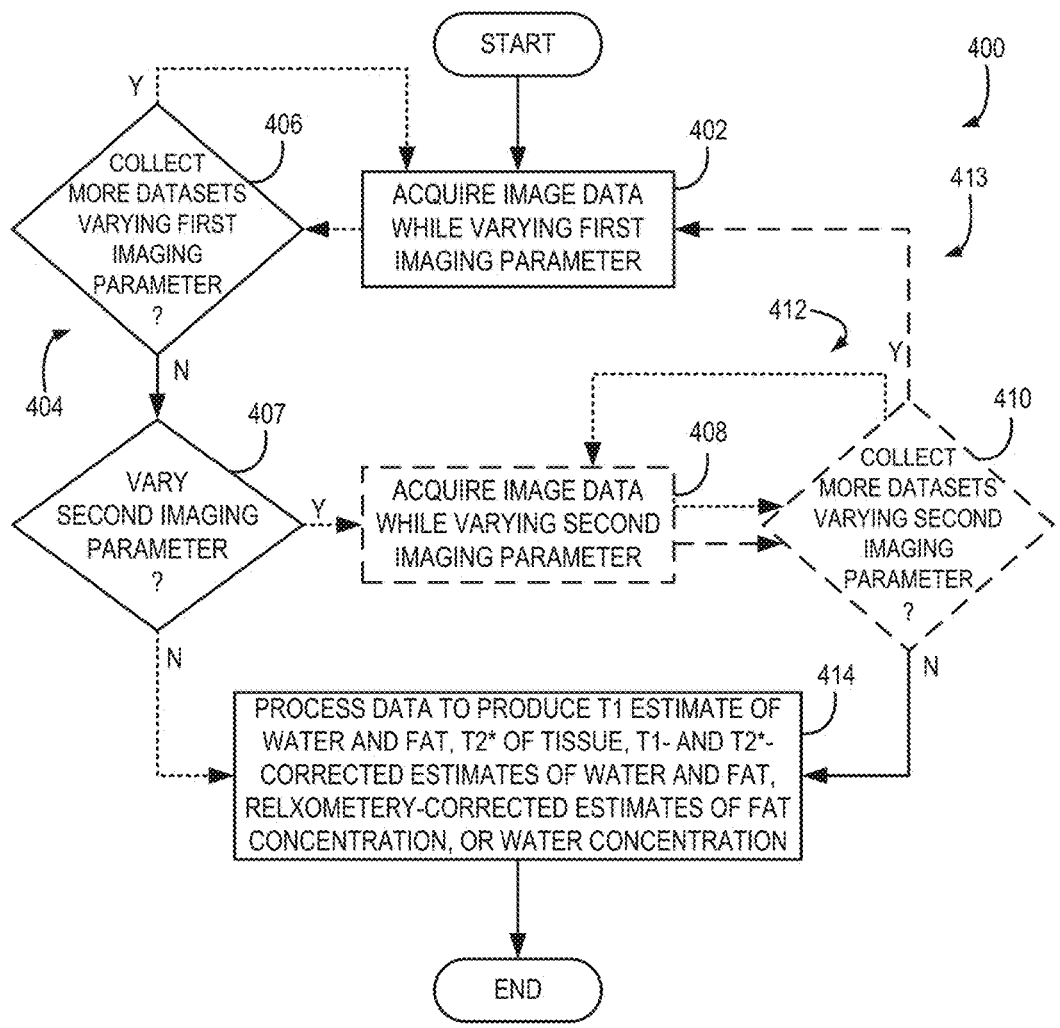
FIG. 4 is a flow chart setting forth one non-limiting example for controlling the MRI system of claim 1 in accordance with the present disclosure.

Referring to FIG. 4, one non-limiting example of a method 400 implementing these strategies acquires multiple datasets, each with different T1 weighting achieved by varying one or more imaging parameters, such as FA and/or TR. That is, as will be described, the method 400 may acquire multiple datasets, each with different T1 weighting, by varying FA between datasets, varying TR between datasets, or varying both FA and TR, either sequentially or in an interleaved fashion. That is, the data can be acquired by altering one (or both) of two imaging parameters: the FA and/or the TR. Therefore, altering the FA and/or TR, either sequentially or in an interleaved fashion, or combined sequential and interleaved, provides the desired datasets, including varied T1 weighting.

Specifically, the method 400 begins by acquiring image data to form a first dataset by varying a first imaging parameter at process block 402. As described above, the first imaging parameter may be a FA of the excitation pulse 200, 302, or may be the TR 223, 320. In a first implementation, a loop 404 may be performed to acquire datasets by only varying the first parameter. In this case, at decision block 406, if all datasets to be acquired using the varied first parameter have not yet been completed, process block 402 is repeated to acquire another dataset using a different value of the first imaging parameter that is being varied (i.e., with either a further varied FA or TR).

However, it is contemplated that, in some circumstances, it may be desirable to collect datasets when varying multiple imaging parameters. In this non-limiting example, one may wish to collect datasets when varying the first imaging parameter and collect datasets when varying a second imaging parameter, whether in series or in an interleaved fashion. Thus, at decision block 406, if all datasets desired to be collected when varying the first imaging parameter have been acquired or if collecting more datasets by varying the first imaging parameter is not desired at this time (e.g., such as during an interleaved process that varies the first imaging parameter then varies the second imaging parameter), the process 400 proceeds to decision block 207. At decision block 407, if varying the second imaging parameter is not desired, the process 400 proceeds to processing the data, as will be described, at process block 414. However, if datasets acquired when varying the second imaging parameter are desired, either as part of a sequential or interleaved acquisition plan, the process 400 proceeds to process block 408 where image data is acquired while varying the second imaging parameter.

At decision block 410, if more datasets acquired while varying the second imaging parameter are desired, this can be achieved as either part of a sequential acquisition process or an interleaved process. Namely, if performing a sequential acquisition where all dataset acquired when varying the first imaging parameter are acquired before acquiring datasets when varying the second imaging parameter, decision block 406 results in a direct loop back to process block 402 before continuing onto decision block 407.

Using this loop 404, once all datasets acquired varying the first imaging parameter have been completed, the process 400 continues by acquiring image datasets with varied second imaging parameters at process block 408. Thereafter, at decision block 410 the process continues to acquire all datasets with the varied second image parameter at process block 408. However, further performance of process block 408 can be performed repeatedly, as in a sequential acquisition, or following performance of process block 402, to achieve an interleaved acquisition.

For example, in a sequential acquisition, process block 402 is repeated until, at decision block 406, all datasets have been collected. Only then is process block 408 reached and, following decision block 410, loop 412 is followed to repeat process block 408 until all datasets with the varied second imaging parameter are collected.

In a sequential acquisition, once process block 402 is performed once, no more datasets varying the first imaging parameter are desired at decision block 406, until after performing an acquisition varying the second imaging parameter at process block 408. In this interleaved process, at decision block 410, when more datasets varying the second imaging parameter are desired, the process 400 follows loop 413 to first acquire more datasets when varying the first imaging parameter.

Regardless of whether one or more imaging parameters are varied and, if multiple imaging parameters are varied, whether the acquisition is sequential or interleaved, once all datasets have been collected, process block 414 is performed. That is, at process block 414, a T1 estimate of water and fat, T2* of tissue, and T1- and T2*-corrected estimates of water and fat signals can all be derived. As the water and fat signals are relaxometry-corrected, relaxometry-corrected estimates of fat concentration (proton density fat fraction) or water concentration (proton density water fraction) can also be calculated at process block 414.

In particular, a joint, nonlinear estimation may be used to provide an estimate of a fat-corrected T2*map. Notably, the fat corrected T2*map estimated from the joint nonlinear fit, is both inherently fat-corrected and is also derived from the same underlying source data as the T1 maps. Thus, it is perfectly co-registered with the T1 maps. This allows subsequent correction for the presence of iron and its impact on T1 mapping. By acquiring multiple 3D SGRE datasets with various T1 weighting, achieved by varying the TR in interleaved or sequential manner, and/or by varying the flip angle, an iron corrected and fat corrected T1 map of water tissue can be estimated, all while overcoming the shortcomings of traditional methods for producing T1 maps.

When interleaving the varying of the FA and/or TR on a TR-by-TR basis, a pseudo-steady state is crated with two alternating signal levels. More particularly, a generalized signal model for single voxel SGRE signal acquired with multiple echoes and at different T1-weighting (through changes in TR and/or flip angle) can be written as:

$$s(W, F, \phi, R2^*, \psi, T1_f, T1_w; t_{n,m}, \alpha_m, TR_m) = \quad \text{Eqn. 3}$$

$$e^{i(2\pi\psi \cdot t_{n,m})} \cdot e^{-R2^* \cdot t_{n,m}} \cdot e^{i\phi} \left( W \frac{\left(1 - e^{-\frac{TR_m}{T1_w}}\right) \sin(\alpha_m)}{\left(1 - \cos(\alpha_m) e^{-\frac{TR_m}{T1_w}}\right)} + \right.$$

$$\left. F \frac{\left(1 - e^{-TR_m/T1_f}\right) \sin(\alpha_m)}{\left(1 - \cos(\alpha_m) e^{-\frac{TR_m}{T1_f}}\right)} \cdot \sum_{p=1}^{P} r_p e^{i2\pi \cdot \Delta f_p \cdot t_{n,m}} \right);$$

where W and F are the amplitudes of water and fat proton densities, $\varphi$ is the common initial phase of water and fat signal, $\psi$ denotes the field inhomogeneity of the voxel (Hz), and $r_p$ and $\Delta f_p$ are the relative amplitudes and frequency offsets, respectively, of the multi-peak fat signal (which contains P separate pre-calibrated peaks). $TR_m$, $\alpha_m$ are repetition time and flip angle, respectively, of the $m^{th}$ acquisition, and $t_{n,m}$ denotes the echo time of the $n^{th}$ echo in the $m^{th}$ acquisition.

Thus, from these datasets, process block 414 can produce estimates T1 of water and fat, R2*(=1/T2*) and T1- and T2*-corrected estimates of water and fat signals, which can be combined to estimate relaxation-corrected estimates of proton density fat fraction. The T2*of water and fat in iron overloaded tissue are known to be very similar and the constraint that the T2*of water and fat signals are equal has been well-validated, at least in liver. Additionally, all of the fat peaks can be assumed to experience the same T1 relaxation.

By acquiring the signal, s, at multiple echo times (index n) and at different T1 weightings (index m), and performing a non-linear least-squares fitting, simultaneous estimation of T1 of water and fat, T2*, and PDFF can be performed. For tissues with low fat (or water) signal, regularization can be used to constrain the fitting of T1 estimates of the species with low signal, to a reasonable estimate that does not negatively impact the estimation of other parameters.

As described the particular implementation of acquisition strategy can be varied. The desired acquisition strategy can be selected based on practical constraints, such as desired scan time and acquisition efficiency. To this end, three non-limiting examples of such strategies are provided in FIGS. 5A-5D.

Figure 5A:
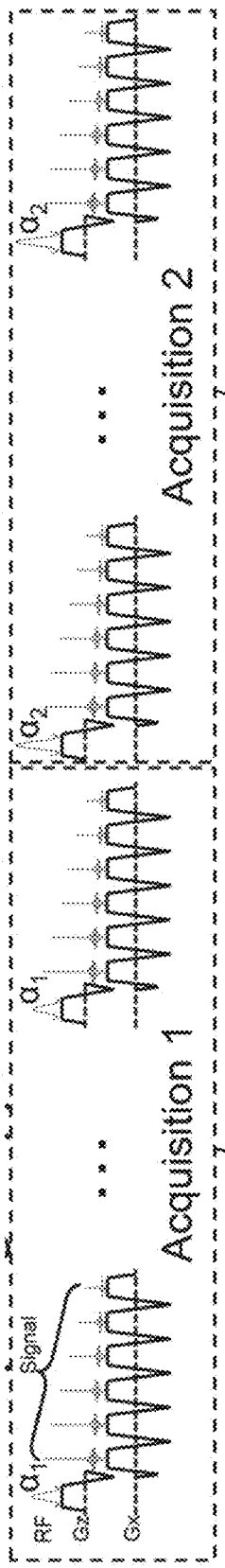
FIG. 5A is a graphic representation of a pulse sequence that can be used to when carrying out the process described with respect to FIG. 4.

Specifically, referring to FIG. 5A, a multi-flip angle (MFA) imaging implementation is illustrated that uses two (or more) multi-echo CSE-MRI acquisitions 500, 502 that are performed sequentially, each at a different flip angle ($\alpha_1$ and $\alpha_2$) to create differential T1 weighting. In the illustrated, non-limiting example, 6 echoes are acquired for both acquisitions, with two different flip angles and the same TR. Joint estimation of the various parameters is then performed. This implementation doubles the scan time, which may be challenging for breath-hold applications. The illustrated dual-flip angle implementation not only provides T1-corrected fat quantification, but achieves T2*- and fat-corrected T1-mapping. In addition, because T2*is also estimated simultaneously, it can be used to correct T1 empirically for the presence of iron.

Figure 5B:
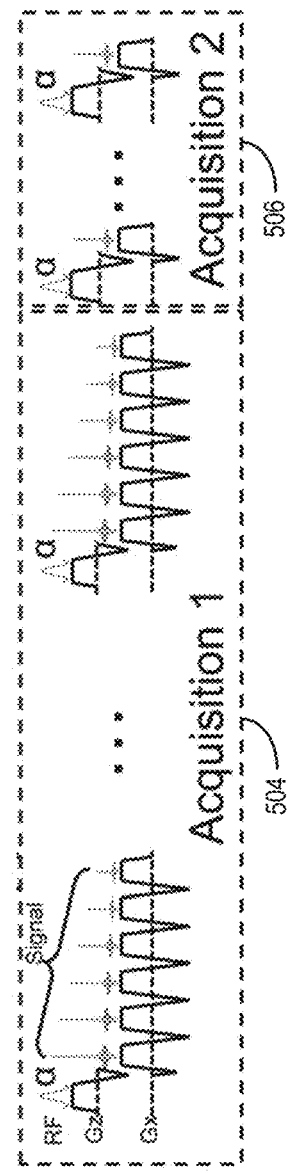
FIG. 5B is a graphic representation of another pulse sequence that can be used to when carrying out the process described with respect to FIG. 4.

Referring to FIG. 5B, a multi-TR (MTR) imaging implementation is illustrated that performs a first acquisition 504 that acquires a full 6-echo CSE dataset, followed by a second acquisition 506 that acquires truncated CSE dataset with a reduced number of echoes per TR, even as few as one echo. The TR for the second acquisition 506 is much shorter than the first acquisition 504, leading to a relatively short scan time penalty. In this case, both the TR and the flip angle can be varied in order to maximize the noise performance of this acquisition. While this reduces the number of echoes necessary to separate water and fat, and estimate T2*, sufficient data can be acquired to perform simultaneous estimation of T1, T2*and PDFF. Differential T1 weighting can also be introduced by varying the angle between the two acquisitions. This implementation uses the additional acquisition of a single echo, as part of the joint fitting to estimate T1, PDFF, and T2*, leading to only a minor scan time penalty.

Figure 5C:
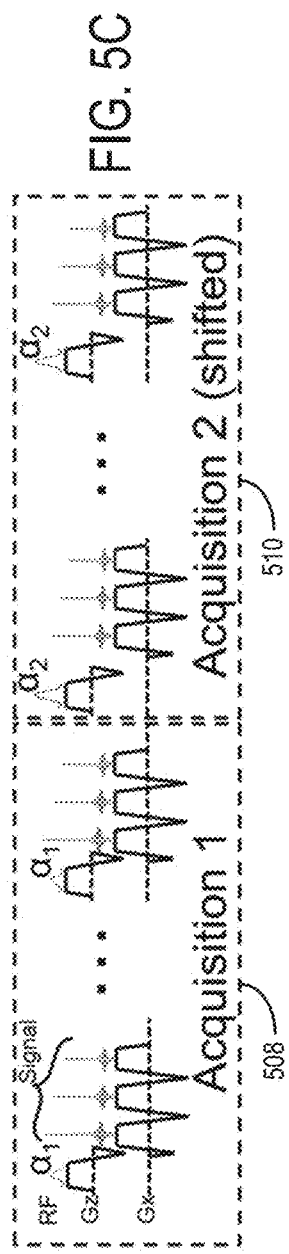
FIG. 5C is a graphic representation of yet another pulse sequence that can be used to when carrying out the process described with respect to FIG. 4.

Referring to FIG. 5C, a CSE-MRI acquisition may use multiple shots of multiple echoes acquired in multiple TR. For example, at 3T, due to the higher chemical shift at 3T, compared to 1.5T, optimal echo times are shorter, and 6 echoes are typically acquired in two interleaved shots of 3 echoes per TR. In this case, the flip angle ($\alpha_1$ and $\alpha_2$) used for these two acquisitions 508, 510 may be varied to create two CSE-MRI datasets with differential weighting. In this situation, there is no scan time penalty. In the situation where the echo spacing requires more than one shot, rather than acquiring each shot with the same flip angle, it is possible to acquire these shots at different flip angles, thus introducing differential T1 weighting, with no scan time penalty.

Figure 5D:
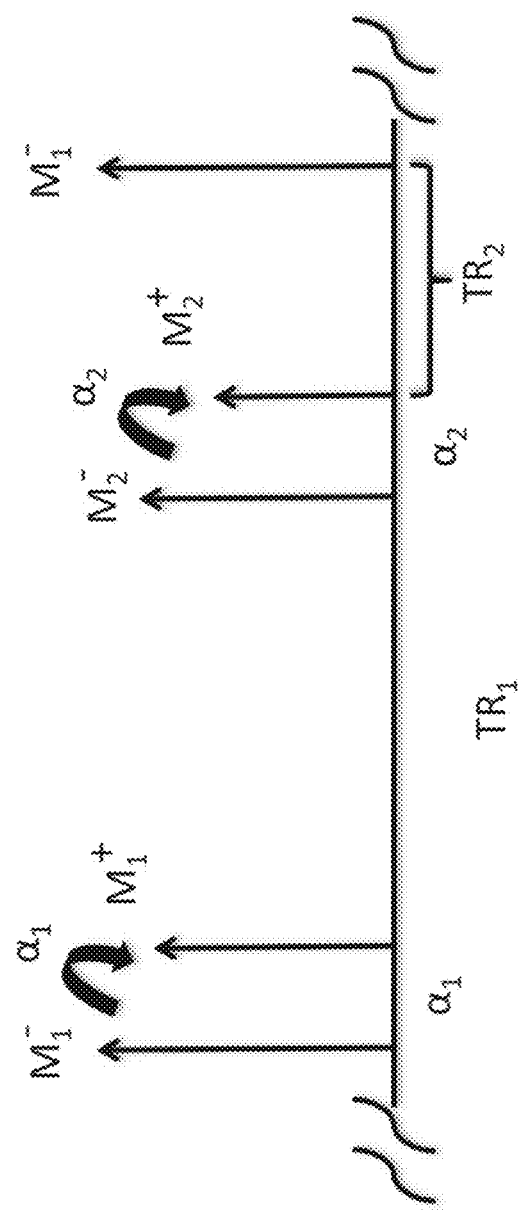
FIG. 5D is a graphic representation of a portion of the pulse sequence of FIG. 5C provided to explain the signal acquired using a pulse sequence such as that illustrated in FIG. 5C.

Referring to FIG. 5D, an illustration of longitudinal magnetization over a cycle of equilibrated SGRE signal with alternating TR and FA, such as described with respect to FIG. 5C, is illustrated. With the example provided in FIG. 5D, it can be shown that the signal is given here by:

$$M_1^+ = \cos\alpha_1 M_1^- \qquad \text{Eqn. 4;}$$

$$M_2^- = M_0(1-E_{1,1}) + E_{1,1}M_1^+ \qquad \text{Eqn. 5;}$$

$$M_2^+ = \cos\alpha_2 M_2^- \qquad \text{Eqn. 6;}$$

$$M_1^- = M_0(1-E_{1,2}) + E_{1,2}M_2^+ \qquad \text{Eqn. 7;}$$

where $E_{1,1} = e^{-TR_1/T1}$ and $E_{1,1} = e^{-TR_2/T1}$ Then Equation 4 can be substituted into Equation 5 to give:

$$M_2^- = M_0(1-E_{1,1}) + E_{1,1}\cos\alpha_1 M_1^- \qquad \text{Eqn. 8; and}$$

Equation 6 can be substituted into Equation 7 to give:

$$M_1^- = M_0(1-E_{1,2}) + E_{1,2}\cos\alpha_2 M_2^- \qquad \text{Eqn. 9.}$$

Substituting Equations 8 into Equation 9 then gives:

$$M_1^- = \frac{M_0(1-E_{1,2}+(1-E_{1,1})E_{1,2}\cos\alpha_2)}{1-E_{1,1}E_{1,2}\cos\alpha_1\cos\alpha_2}. \qquad \text{Eqn. 10.}$$

Symmetry of the equation gives:

$$M_2^- = \frac{M_0(1-E_{1,1}+(1-E_{1,2})E_{1,1}\cos\alpha_1)}{1-E_{1,1}E_{1,2}\cos\alpha_1\cos\alpha_2}. \qquad \text{Eqn. 11.}$$

The transverse magnetization after the $\alpha_1$ RF pulse is given by:

$$S_1(t) = \sin\alpha_1 M_1^- e^{-R2^*t}; \text{ and} \qquad \text{Eqn. 12}$$

$$S_1(t) = \frac{\sin\alpha_1 M_0(1-E_{1,2}+(1-E_{1,1})E_{1,2}\cos\alpha_2)}{1-E_{1,1}E_{1,2}\cos\alpha_1\cos\alpha_2}e^{-R2^*t}. \qquad \text{Eqn. 13}$$

Likewise, the transverse magnetization after the $\alpha_2$ RF pulse is given by:

$$S_2(t) = \sin\alpha_2 M_2^- e^{-R2^*t}; \text{ and} \qquad \text{Eqn. 14}$$

$$S_2(t) = \frac{\sin\alpha_2 M_0(1-E_{1,1}+(1-E_{1,2})E_{1,1}\cos\alpha_2)}{1-E_{1,1}E_{1,2}\cos\alpha_1\cos\alpha_2}e^{-R2^*t}. \qquad \text{Eqn. 15}$$

In general, the use of two acquisitions at differential T1 weighting is a practical strategy due to scan time constraints. However, more than two acquisitions may be practical for some situations where scan time considerations are less important.

Also, the TR may be determined by practical constraints related to the CSE-MRI acquisition, although it can be varied by changing the echo train length, and other image parameters (e.g., matrix, field of view, bandwidth), or by adding dead time, which is less efficient. The choices of desired TR and flip angle can be determined using, for example, either Cramér-Rao bound analysis or Monte Carlo simulations that predict the combination of TR and flip angle that maximizes the noise performance of the parameter(s) of interest, such as T1 of water or fat, T2*, or PDFF.

Both magnitude- and complex-based CSE-MRI methods can be used to estimate T2*, water, fat and T1 maps. If complex-based CSE-MRI is used, the field map ($\psi$) is also estimated, which can be used for a variety of applications such as shimming and also quantitative susceptibility mapping (QSM).

Also, it is noted that multi-flip angle and multi-TR approaches can be acquired as part of time-resolved image acquisition strategies, including view-sharing methods. The use of rapid and simultaneous T1 and T2*mapping with time-resolved imaging may be advantageous for dynamic contrast enhanced imaging. Currently, time-resolved contrast enhanced T1 and T2*weighted acquisitions are used to estimate tissue perfusion. However, the relationship between these relaxation parameters and observed signal is nonlinear. Direct estimation of actual T1 and T2*maps can be highly advantageous for quantification of actual contrast agent concentration in tissue, improving our ability to quantify tissue perfusion. Further, the simultaneous estimation of both T1 and T2*can be used to gain additional insight into the pharmacokinetics of these agents in tissue and thus improve our ability to quantify perfusion.

Notably, by varying the TR, additional advantages can be achieved. For example, because, as mentioned above, B1 inhomogeneity can be estimated from the signal, estimates of the T1 of water, T1 of fat, R2*, and PDFF can be generated that are corrected for B1 inhomogeneities. In this case, T1 can be estimated accurately without the confounding effects of B1 inhomogeneity, which overcomes a long-standing problem.

The signal model used for joint PDFF/R2*/T1 joint estimation can be written as follows:

$$s_{m,n}(TE_{m,n}, \alpha_m, TR_m) = \qquad \text{Eqn. 16}$$

$$\left(\rho_W\left(\frac{(1-e^{-TR_m/T1_w})\sin\alpha_m}{1-\cos\alpha_m e^{-TR_m/T1_w}}\right) + \rho_F\left(\frac{(1-e^{-TR_m/T1_f})\cos\alpha_m}{1-\cos\alpha_m e^{-TR_m/T1_f}}\right) \cdot \right.$$

$$\left.\sum_{p=1}^{P} r_p e^{i2\pi\cdot\Delta f_p\cdot TE_{m,n}}\right)e^{-R2^*\cdot TE_{m,n}} \cdot e^{i(2\pi\psi\cdot TE_{m,n}+\phi)}.$$

where $\rho_W$ and $\rho_F$ are water and fat signals; $\varphi$ is the initial phase; $\psi$ is the field map; $r_p$ and $\Delta f_p$ are the relative amplitudes and frequency shifts, respectively, of a pre-calibrated spectral model of fat with P separate peaks; and R2* is the signal decay rates. Also, $TR_m$ and $\alpha_m$ are the repetition time and flip angle of the $m^{th}$ T1-weighting; $TE_{m,n}$ is the echo time of the $n^{th}$ echo in the $m^{th}$ T1-weighting; and T1w and T1f are the T1 values of water and fat, respectively. Estimation of $\rho_W$, $\rho_F$, R2* and T1w and T1f can be performed using non-linear least squares fitting. Water-fat swaps can be avoided using a graph-cut method.

Proton density fat fraction ($\eta$) is estimated from water and fat signals:

$$\eta = \frac{\rho_f}{\rho_f + \rho_w}. \qquad \text{Eqn. 17}$$

Equation 16 can also be written as:

$$s_{m,n}(TE_{m,n}, \alpha_m, TR_m) = \qquad \text{Eqn. 18}$$
$$A\left[(1-\eta)\left(\frac{(1-e^{-TR_m/T1w})\sin\alpha_m}{1-\cos\alpha_m e^{-TR_m/T1w}}\right) + \eta\left(\frac{(1-e^{-TR_m/T1f})\sin\alpha_m}{1-\cos\alpha_m e^{-TR_m/T1f}}\right)\right.$$
$$\left.\sum_{p=1}^{P} r_p e^{i2\pi\cdot\Delta f_p \cdot t_{n,m}}\right] e^{-R2^*\cdot TE_{m,n}} \cdot e^{i(2\pi\psi\cdot TE_{m,n}+\phi)};$$

where A represents a constant term, such that the proton density fat fraction can be estimated directly.

B1 inhomogeneities lead to unanticipated changes in the amplitude of the anticipated flip angle. A good assumption is that the proportional error in the anticipated flip angle is constant (at a given spatial location) for different pulses. The true flip angle can be written as:

$$\alpha'_m = \beta\alpha_m \qquad \text{Eqn. 19;}$$

where $\alpha'_m$ is the true flip angle, $\alpha_m$ is the intended flip angle, and $\beta$ is a factor that represents the B1 inhomogeneity such that $\beta=1$ represents no inhomogeneity, $\beta>1$ leads to a true flip angle exceeding the anticipated flip angle, and $\beta<1$ leads to flip angles less than anticipated. In this context, for a given spatial location, $\beta$ is assumed to be constant across all flip angles. Thus, equation 16 can be rewritten as:

$$s_{m,n}(TE_{m,n}, \alpha_m, TR_m, \beta) = \qquad \text{Eqn. 20}$$
$$\left(\rho_W\left(\frac{(1-e^{-TR_m/T1w})\sin\beta\alpha_m}{1-\cos\beta\alpha_m e^{-TR_m/T1w}}\right) + \rho_F\left(\frac{(1-e^{-TR_m/T1f})\sin\beta\alpha_m}{1-\cos\beta\alpha_m e^{-TR_m/T1f}}\right)\right.$$
$$\left.\sum_{p=1}^{P} r_p e^{i2\pi\cdot\Delta f_p \cdot TE_{n,m}}\right) e^{-R2^*\cdot TE_{m,n}} \cdot e^{i(2\pi\psi\cdot TE_{m,n}+\phi)};$$

where $\beta$ can be estimated in addition to the other parameters estimated using the procedure described above. This allows for direct estimation of both the B1 inhomogeneity ($\beta$) and also estimates of proton density fat fraction ($\eta$) that are independent of B1 inhomogeneities. Varying T1 weighting by flip angle alone, with no variation in TR, will not allow the B1 inhomogeneity ($\beta$) to be estimated, because changes in flip angle are indistinguishable from B1 inhomogeneity, as indicated in equation 19. However, if the TR is varied between T1 weighting, the precise change in T1 weighting is known with high precision because TR values are known very accurately. This allows for simultaneous estimation of the B1 inhomogeneity ($\beta$), so long as the assumption that $\beta$ is constant between RF pulses is valid.

Finally, we also note that the effects of B1 inhomogeneity can also be incorporated into interleave acquisitions with T1 weighting alternating between each TR. For T1 weighting that alternates with each TR, the two alternating signals can be written as:

$$s_{1,n}(TE_{1,n}, \alpha_1, TR_1) = \left(\rho_W\left(\frac{(1-e^{-TR_2/T1w} + (1-e^{-TR_1/T1w})e^{-TR_2/T1w}\cos\alpha_2)\sin\alpha_1}{1-e^{-TR_1/T1w}e^{-TR_2/T1w}\cos\alpha_1\cos\alpha_2}\right) + \right. \qquad \text{Eqn. 21}$$
$$\left.\rho_F\left(\frac{(1-e^{-TR_2/T1f} + (1-e^{-TR_1/T1f})e^{-TR_2/T1f}\cos\alpha_2)\sin\alpha_1}{1-e^{-TR_1/T1f}e^{-TR_2/T1f}\cos\alpha_1\cos\alpha_2}\right)\right.$$
$$\left.\sum_{p=1}^{P} r_p e^{i2\pi\cdot\Delta f_p\cdot TE_{1,n}}\right) e^{-R2^*\cdot TE_{1,n}} \cdot e^{i(2\pi\psi\cdot TE_{1,n}+\phi)}; \text{ and}$$

$$s_{2,n}(TE_{2,n}, \alpha_2, TR_2) = \left(\rho_W\left(\frac{(1-e^{-TR_2/T1} + (1-e^{-TR_1/T1})e^{-TR_1/T1}\cos\alpha_1)\sin\alpha_2}{1-e^{-TR_1/T1w}e^{-TR_2/T1w}\cos\alpha_1\cos\alpha_2}\right) + \right. \qquad \text{Eqn. 22}$$
$$\left.\rho_F\left(\frac{(1-e^{-TR_1/T1} + (1-e^{-TR_2/T1})e^{-TR_1/T1}\cos\alpha_1)\sin\alpha_2}{1-e^{-TR_1/T1}e^{-TR_2/T1}\cos\alpha_1\cos\alpha_2}\right)\cdot\sum_{p=1}^{P} r_p e^{i2\pi\cdot\Delta f_p\cdot TE_{2,n}}\right)$$
$$e^{-R2^*\cdot TE_{2,n}} \cdot e^{i(2\pi\psi\cdot TE_{2,n}+\phi)}.$$

Similar to above, we can also consider the B1 homogeneity ($\beta$) as before, ie:

$$s_{1,n}(TE_{1,n}, \alpha_1, TR_1, \beta) = \qquad \text{Eqn. 23}$$

$$\left(\rho_W\left(\frac{(1-e^{-TR_2/T_{1w}} + (1-e^{-TR_1/T_{1w}})e^{-TR_2/T_{1w}}\cos\beta\alpha_2)\sin\beta\alpha_1}{1-e^{-TR_1/T_{1w}}e^{-TR_2/T_{1w}}\cos\beta\alpha_1\cos\beta\alpha_2}\right) + \right.$$

$$\left.\rho_F\left(\frac{(1-e^{-TR_2/T_{1f}} + (1-e^{-TR_1/T_{1f}})e^{-TR_2/T_{1f}}\cos\beta\alpha_2)\sin\beta\alpha_1}{1-e^{-TR_1/T_{1f}}e^{-TR_2/T_{1f}}\cos\beta\alpha_1\cos\beta\alpha_2}\right)\right) \cdot$$

$$\sum_{p=1}^{P} r_p e^{i2\pi\Delta f_p \cdot TE_{1,n}} \bigg) e^{-R2^* \cdot TE_{1,n}} \cdot e^{i(2\pi\psi \cdot TE_{1,n}+\phi)}; \text{ and}$$

$$s_{2,n}(TE_{2,n}, \alpha_2, TR_2, \beta) = \qquad \text{Eqn. 24}$$

$$\left(\rho_W\left(\frac{(1-e^{-TR_1/T_1} + (1-e^{-TR_2/T_1})e^{-TR_1/T_1}\cos\beta\alpha_1)\sin\beta\alpha_2}{1-e^{-TR_1/T_1}e^{-TR_2/T_1}\cos\beta\alpha_1\cos\beta\alpha_2}\right) + \right.$$

$$\left.\rho_F\left(\frac{((1-e^{-TR_1/T_1} + (1-e^{-TR_2/T_1})e^{-TR_1/T_{1f}}\cos\beta\alpha_1)\sin\beta\alpha_2)}{(1-e^{-TR_1/T_1}e^{-TR_2/T_{1f}}\cos\beta\alpha_1\cos\beta\alpha_2)}\right)\right) \cdot$$

$$\sum_{p=1}^{P} r_p e^{i2\pi\Delta f_p \cdot TE_{2,n}} \bigg) e^{-R2^* \cdot TE_{2,n}} \cdot e^{i(2\pi\psi \cdot TE_{2,n}+\phi)}.$$

Non-linear least squares fitting can also be performed to estimate $\beta$ along with T1w, T1f, R2*, and $$\eta = \frac{\rho_f}{\rho_f + \rho_w}.$$

The above-described systems and methods have been implemented to demonstrate the above-described improvements. In particular, the above-described MFA technique was tested using a DFA implementation that facilitates T1-corrected PDFF estimates at the cost of doubling scan time compared to small flip angle (SFA) methods. Also, the above-described MTR technique was tested using a dual-TR (DTR) implementation for fat quantification. In this implementation, 2 SGRE datasets were acquired sequentially, one with a shortened echo train and reduced TR to alleviate scan time penalties.

Monte-Carlo simulation based on DFA, SFA, and the DTR methods were performed to assess the noise performance of the corresponding PDFF estimators. 3000 trials were performed over a PDFF range of 0-100%. The signal was generated using the following parameters: T1$_w$=583 m, T1$_f$=343 ms, R2*=40 s$^{-1}$, and B$_0$=1.5T. Cramér-Rao lower bound (CRLB) of PDFF estimator was calculated using the same parameters for comparison.

Acquisition parameters were to be chosen within reasonable range to minimize the maximum estimator variance predicted by CRLB over PDFF between 0% and 40%, those typically seen in liver disease. Table 1 provides acquisition for both simulations and phantom experiments:

TABLE 1

| | SFA | DFA Acquisition 1 | DFA Acquisition 2 | DTR Acquisition 1 | DTR Acquisition 2 |
|---|---|---|---|---|---|
| | | Simulation | | | |
| TE$_1$/ms | 1 | 1 | 1 | 1 | 1 |
| $\Delta$TE/ms | 2.0 | 2.0 | 2.0 | 2.0 | / |
| TR/ms | 14 | 14 | 14 | 14 | 4.5 |
| $\alpha$ | 3° | 6° | 15° | 6° | 15° |
| | | Phantom Experiments | | | |
| TE$_1$/ms | 1.9 | 1.9 | 1.9 | 1.9 | 3.4 |
| $\Delta$TE/ms | 2.0 | 2.0 | 2.0 | 2.0 | / |
| TR/ms | 20.2 | 20.2 | 20.2 | 20.2 | 5 |
| $\alpha$ | 5° | 5° | 15° | 5° | 15° |
| Scan Time | 67 s | 67 s | 67 s | 67 s | 10 s |

A flip angle of 3° was chosen for the SFA. White Gaussian noise was chosen such that SNR is approximately 20 for SFA acquisition. SNR was normalized by square root of scan time in DFA and DTR. T1$_w$, T1$_f$ are constrained to [1 ms, 2000 ms] in non-linear least square fit[4] in DFA and DTR to avoid instability when water or fat signals are low.

Phantom experiments were performed on a clinical 1.5T MRI system using single channel quadrature head coil to evaluate the DTR method. DTR, DFA, and SFA fat quantification with parameters listed in Table 1 were performed on a set of fat fraction phantom with PDFF value of 0%, 5%, 10%, 20%, 30%, 40% and T1water≈1400 ms, T1fat≈300 ms. A doped water phantom was added for validation T1 estimate. In addition, a single SGRE acquisition with $\alpha$=15° was acquired reconstructed to demonstrate the T1-bias that will occur when correct for T1 weighting is not performed.

Figure 6:
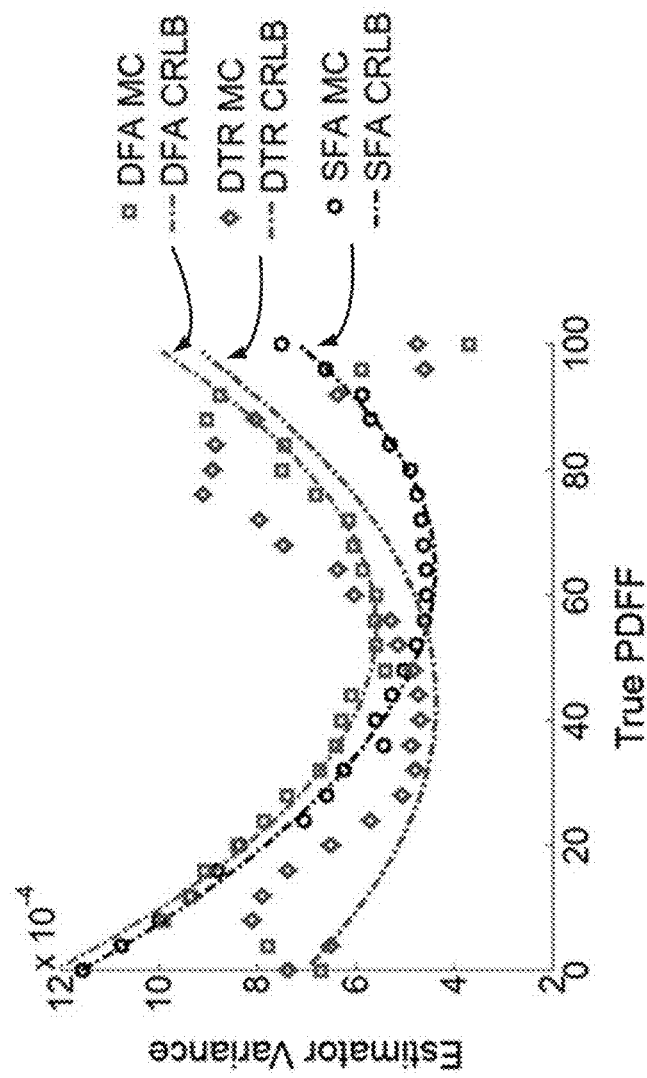
FIG. 6 is a graph providing a comparison of multiple techniques for acquiring data to produce T1 maps and illustrating the positive performance of the techniques described in the present disclosure.
Figure 7:
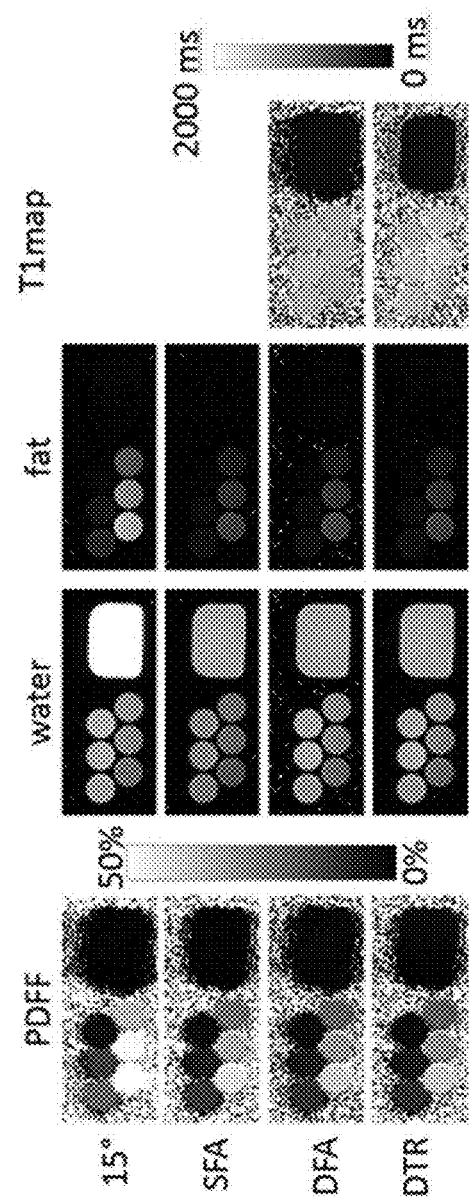
FIG. 7 is series of images of a phantom providing a comparison of multiple techniques for acquiring data to produce T1 maps, PDFF, water images, and fat images and illustrating the positive performance of the techniques described in the present disclosure.
Figure 8:
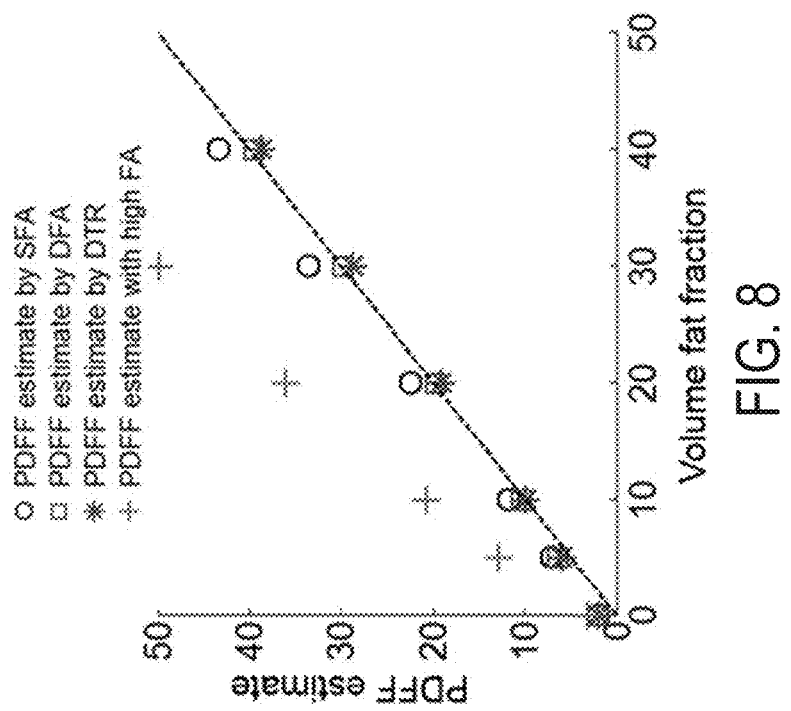
FIG. 8 is a graph providing a comparison of multiple techniques for acquiring data to produce T1 maps and illustrating the positive performance of the techniques described in the present disclosure.

Cramér-Rao lower bound (CRLB) and Monte-Carlo simulation showed agreement and demonstrated improved noise performance of the DTR method compared with SFA and DFA methods, as illustrated in FIG. 6. The agreement between CRLB and Monte Carlo simulations breaks down for very low and very high fat fraction due to the difficulty in the estimation of T1 with very low signals from either species as well as the constraints imposed on the least square fit. DFA showed higher estimator variance than SFA due to the limited choice of flip angles. The DFA proposed provided robust T1 corrected fat quantification, as shown in FIG. 7. The SFA, DFA, and DTR methods all successfully reduced T1 bias. The SFA method showed some residual T1 bias, while DFA and DTR methods further reduced T1 bias in their PDFF estimates. This comparison of residual T1 bias was further quantitatively confirmed, as illustrated in FIG. 8, by the PDFF estimates averaged inside an ROI for each method.

The DTR method provides a fully T1-corrected estimation of PDFF. Further, the studies demonstrated improved theoretical noise performance of the DTR method compared with SFA and DFA methods. The reduced scan time of the DTR method, compared with the DFA method, makes it more practical for abdominal applications, such as fat quantification in the liver. The DFA method provides accurate T1-corrected fat quantification in the abdomen.

Therefore, systems and methods are provided for the use of multiple datasets with different T1 weighting generated by the use of variable TR (sequential or interleaved) and/or multiple flip angles. By acquiring multiple (two or more) datasets with differential T1 weighting, as well as multiple echoes (typically six or more), T1 maps can be generated that are both fat-corrected and iron-corrected. This approach is able to achieve this with a single combined acquisition that can be performed as a single total acquisition, and, thereby, the underlying source data are all inherently co-registered with one another. That is, true simultaneously produced and co-registered estimations of T1 (water and fat signals), R2*, and PDFF are now clinically available. This allows for the ready creation of fat- and iron-corrected T1 maps of tissue, fat-corrected R2*maps (with no need to correct for T1 when estimating R2*), and T1- and R2*-corrected maps of PDFF based on the given acquired dataset. Joint PDFF, T2*(or R2*), and T1 fitting is feasible in a single breath-hold.

Thus, a major unmet need is satisfied. Specifically, the above-described systems and methods provide estimates of T1 that are inherently corrected for the presence of fat and provide simultaneous and spatially co-localized estimates of T2*that can be used to perform empirical iron-corrected estimates of T1.

By performing joint fitting of T1, T2*(or R2*), water and fat signals across multiple echoes and acquisitions with differential T1 weighting (via changes in flip angle and/or TR), the number of echoes required to perform this fitting can be reduced, shortening scan time. Examples include the use of a single echo in a second acquisition or the use of different flip angles between two shots of interleaved echo trains. This approach can be used to estimate tissue T1, tissue fat concentration (PDFF), tissue water concentration (PDWF), and tissue T2*. The PDFF and PDWF estimates are inherently corrected for both T1 and T2*.

Clinical applications include estimation of T1, T2*and PDFF in the liver, pancreas, heart, muscle and other organs where these biomarkers can be used to assess a variety of disease processes. PDWF is a metric that can be used to measure the volume and concentration of fibroglandular tissue of the breast as a biomarker of breast density, which is known to confer increased risk of future breast cancer.

Thus, the present disclosure provides rapid MFA and/or MTR methods to estimate fat-corrected T1 and T2*maps as part of dynamic time resolved imaging (including view sharing strategies) performed during the injection of contrast agents, to quantify tissue perfusion. The simultaneous estimation of T1 and T2*may be used to improve the characterization and quantification of tissue perfusion.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for creating a T1 map of a subject using a magnetic resonance imaging (MRI) system, the method including steps comprising:
   (i) controlling the MRI system using a single pulse sequence to acquire, from the subject, a plurality of datasets with varied T1 weighting created by varying a repetition time (TR) between repetitions of the single pulse sequence; and
   (ii) using an MR signal model and the plurality of datasets, generating a T1 map of the subject that is corrected for an influence of a presence of fat and a presence of iron in the subject on T1 weighting in the plurality of datasets.

2. The method of claim 1 wherein step (ii) includes generating a spatially-co-registered T2*estimates from the plurality of datasets and using the spatially-co-registered T2*estimates to correct the T1 map for the influence of a presence of fat and a presence of iron in the subject on T1 weighting in the plurality of datasets.

3. The method of claim 1 wherein step (ii) includes using the MR signal model and the plurality of datasets to perform joint fitting of T1, T2*, water, and fat signals across multiple echoes sampled to acquire the plurality of datasets.

4. The method of claim 3 wherein the T1 is a T1 of water and a T1 of fat.

5. The method of claim 1 wherein step (i) includes acquiring a different number of echoes to between repetitions of the single pulse sequence to vary the TR.

6. The method of claim 5 wherein a first repetition of the single pulse sequence includes acquiring at least six echoes and a second repetition of the single pulse sequence includes acquiring less than six echoes.

7. The method of claim 6 wherein the second repetition of the single pulse sequence includes acquiring one echo.

8. The method of claim 1 wherein step (ii) includes using the plurality of datasets to determine a proton density fat fraction (PDFF), a proton density water fraction (PDWF), and a T2*estimate, and wherein the PDFF and PDWF are inherently corrected for both T1 and T2*.

9. The method of claim 1 wherein step (i) includes varying a flip angle (FA) of an excitation pulse of the single pulse sequence during repetitions of the single pulse sequence to vary the T1 weighting in at least some of the plurality of datasets.

10. The method of claim 9 wherein an interleaved acquisition is performed by interleaving varying the FA with varying the TR during repetitions of the single pulse sequence to vary the T1 weighting.

11. The method of claim 9 wherein a sequential acquisition is performed by acquiring a first portion of the plurality of datasets by varying the TR during repetitions of the single pulse sequence to vary the T1 weighting and a second portion of the plurality of datasets by varying the FA during repetitions of the single pulse sequence to vary the T1 weighting.

12. The method of claim 1 wherein the plurality of datasets are acquired from a portion of the subject including at least one of liver, pancreas, heart, muscle, or a contrast agent.

13. The method of claim 1 wherein the single pulse sequence is a spoiled gradient echo (SGRE) pulse sequence.

14. A magnetic resonance imaging (MRI) system comprising:
   a magnet system configured to generate a polarizing magnetic field about at least a portion of a subject arranged in the MRI system;
   a plurality of gradient coils configured to apply a gradient field to the polarizing magnetic field;
   a radio frequency (RF) system configured to apply an excitation field to the subject and acquire MR image data from a ROI;
   a computer system programmed to:
      control the plurality of gradient coils and the RF system to perform a single pulse sequence to acquire, from the subject, a plurality of datasets with varied T1 weighting created by varying a repetition time (TR) between repetitions of the single pulse sequence; and
      use an MR signal model and the plurality of datasets, generate a T1 map of the subject that is corrected for an influence of a presence of fat and a presence of iron in the subject on T1 weighting in the plurality of datasets.

15. The system of claim 14 wherein the computer system is further programmed to generate spatially-co-registered T2*estimates from the plurality of datasets and use the spatially-co-registered T2*estimates to correct the T1 map for the influence of a presence of fat and a presence of iron in the subject on T1 weighting in the plurality of datasets.

16. The system of claim 14 wherein the computer system is further programmed to use the MR signal model and the plurality of datasets to perform joint fitting of T1, T2*, water, and fat signals across multiple echoes sampled to acquire the plurality of datasets.

17. The system of claim 14 wherein the computer system is further programmed to acquire a different number of echoes to between repetitions of the single pulse sequence to vary the TR.

18. The system of claim 17 wherein a first repetition of the single pulse sequence includes acquiring at least six echoes and a second repetition of the single pulse sequence includes acquiring less than six echoes.

19. The system of claim 14 wherein the computer system is programmed to use the plurality of datasets to determine a proton density fat fraction (PDFF), a proton density water fraction (PDWF), and a T2*estimate, and wherein the PDFF and PDWF are inherently corrected for both T1 and T2*.

20. The system of claim 14 wherein the computer system is programmed to vary a flip angle (FA) of an excitation pulse of the single pulse sequence during repetitions of the single pulse sequence to vary the T1 weighting in at least some of the plurality of datasets.

21. The system of claim 20 wherein the computer system is further programmed perform an interleaved acquisition by interleaving varying the FA with varying the TR during repetitions of the single pulse sequence to vary the T1 weighting.

22. The system of claim 20 wherein the computer system is further programmed to perform a sequential acquisition by acquiring a first portion of the plurality of datasets by varying the TR during repetitions of the single pulse sequence to vary the T1 weighting and a second portion of the plurality of datasets by varying the FA during repetitions of the single pulse sequence to vary the T1 weighting.

23. A method for creating a T1 map of a subject using a magnetic resonance imaging (MRI) system, the method including steps comprising:
   (i) controlling the MRI system using a single pulse sequence to acquire, from the subject, a plurality of datasets with varied T1 weighting created by varying at least one of a repetition time (TR) and a flip angle (FA) for repetitions of the single pulse sequence; and
   (ii) using an MR signal model and the plurality of datasets, generating a T1 map of the subject that is corrected for an influence of a presence of fat and a presence of iron in the subject on T1 weighting in the plurality of datasets.

24. The method of claim 23 wherein step (i) includes performing an interleaved acquisition by interleaving varying the FA with varying the TR during repetitions of the single pulse sequence to vary the T1 weighting.

25. The method of claim 23 wherein step (i) includes performing a sequential acquisition by acquiring a first portion of the plurality of datasets by varying the TR during repetitions of the single pulse sequence to vary the T1 weighting and a second portion of the plurality of datasets by varying the FA during repetitions of the single pulse sequence to vary the T1 weighting.

26. A method for creating estimating B1 field inhomogeneity of a magnetic resonance imaging (MRI) system, the method including steps comprising:
   (i) controlling the MRI system using a single pulse sequence to acquire a plurality of datasets with varied T1 weighting created by varying a repetition time (TR) between repetitions of the single pulse sequence; and
   (ii) using an MR signal model and the plurality of datasets, estimating B1 inhomogeneities present when acquiring the plurality of datasets.

27. The method of claim 26 wherein (ii) further comprises estimating a T1 of water reflected in the plurality of datasets, T1 of fat reflected in the plurality of datasets, R2*reflected in the plurality of datasets, and proton density fat fraction reflected in the plurality of datasets.

28. The method of claim 27 wherein the estimate of B1 inhomogeneities, T1 of water, T1 of fat, R2*, and proton density fat faction are estimated simultaneously.

29. The method of claim 28 wherein step (ii) includes using the MR signal model and the plurality of datasets to perform joint fitting of T1, T2*, water, and fat signals across multiple echoes sampled to acquire the plurality of datasets.

30. The method of claim 29 wherein the T1 is a T1 of water and a T1 of fat.

31. The method of claim 26 wherein step (i) includes acquiring a different number of echoes between repetitions of the single pulse sequence to vary the TR.

32. The method of claim 31 wherein a first repetition of the single pulse sequence includes acquiring at least six echoes and a second repetition of the single pulse sequence includes acquiring less than six echoes.

33. The method of claim 32 wherein the second repetition of the single pulse sequence includes acquiring one echo.

34. The method of claim 26 wherein step (ii) includes generating a spatially-co-registered T2*estimates from the plurality of datasets and using the spatially-co-registered T2*estimates to identify an influence of fat reflected in the plurality of datasets.

35. The method of claim 26 wherein step (i) includes varying a flip angle (FA) of an excitation pulse of the single pulse sequence during repetitions of the single pulse sequence to vary the T1 weighting in at least some of the plurality of datasets.

36. The method of claim 35 wherein an interleaved acquisition is performed by interleaving varying the FA with varying the TR during repetitions of the single pulse sequence to vary the T1 weighting.

37. The method of claim 35 wherein a sequential acquisition is performed by acquiring a first portion of the plurality of datasets by varying the TR during repetitions of the single pulse sequence to vary the T1 weighting and a second portion of the plurality of datasets by varying the FA during repetitions of the single pulse sequence to vary the T1 weighting.

38. The method of claim 26 wherein the single pulse sequence is a spoiled gradient echo (SGRE) pulse sequence.

39. The method of claim 26 further comprising varying a flip angle of at least some of the repetitions of the single pulse sequence.

\* \* \* \* \*